(12) United States Patent
Kaufman et al.

(10) Patent No.: US 7,475,304 B1
(45) Date of Patent: Jan. 6, 2009

(54) BIT ERROR TESTER

(75) Inventors: Gary H. Kaufman, Dayton, OH (US); James P. Stephens, Sr., Bellbrook, OH (US); George D. Gonczy, Miamisburg, OH (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 476 days.

(21) Appl. No.: 11/070,576

(22) Filed: Feb. 25, 2005

(51) Int. Cl. *G01R 31/28* (2006.01)
(52) U.S. Cl. ............................ 714/724; 714/706
(58) Field of Classification Search ............ None
See application file for complete search history.

(56) References Cited

U.S. PATENT DOCUMENTS 3,721,959 A * 3/1973 George ............ 714/704
4,092,589 A * 5/1978 Chau et al. ............ 714/736
4,428,076 A * 1/1984 Schuon ............ 714/704
5,455,536 A * 10/1995 Kono et al. ............ 329/325
5,528,603 A * 6/1996 Canella et al. ............ 714/736
6,111,603 A   8/2000 Zhang et al.
6,816,988 B2  11/2004 Barford

* cited by examiner

*Primary Examiner*—Jacques Louis-Jacques
*Assistant Examiner*—Steve Nguyen
(74) *Attorney, Agent, or Firm*—AFMCLO/JAZ; Ging S. Tollefson

(57) ABSTRACT

A method and device for comparing two generic digital signals over a wide range of data rates and for counting the number of bit errors between digital signals under the conditions of noise and jamming. The bit error tester of the invention compares the digital signal sent with the digital signal received back from the unit under test and outputs the error signal. In the preferred arrangement of the invention, a field programmable gate array is used and a switch and LED display are used to introduce and monitor a time delay in the sent signal to ensure that the signals are in time alignment prior to comparison.

8 Claims, 6 Drawing Sheets

Test Setup ved data connection at 103, the delay out connection to an oscilloscope

BIT ERROR TESTER

RIGHTS OF THE GOVERNMENT

The invention described herein may be manufactured and used by or for the Government of the United States for all governmental purposes without the payment of any royalty.

BACKGROUND OF THE INVENTION

The invention relates to evaluation and calibration of communications systems and more particularly bit-error testing devices for evaluation and calibration of communication systems.

An issue that has been problematic in communications countermeasures as well as telecommunication test, evaluation and calibration has been the lack of a generic bit-error testing device. Such a device would compare two digital signals over a wide range of data rates and count the number of bit errors that occur between the two signals under the conditions of noise and jamming.

Though there are many bit error testers on the market, all are tailored towards a particular set of frequencies or waveforms. For example, a known prior art bit error tester has a range of 50 Mb/s to 3.6 Gb/s, connections of GPIB, LAN, and Parallel printer port, sub-42 ps risetimes and a mouse and keyboard and costs tens of thousand of dollars. This prior art tester cannot test in the range of a few Mb/s or less. Most prior art bit error testers on the market have a range between 50-100 Mb/s and 3-5 Gb/s. By contrast, the present invention can test in the range of a few Mb/S or less. Additionally, the present invention much more economic, with the cost of the invention coming in below a couple thousand dollars.

A second known prior art bit error tester capable of smaller ranges has a RS-232 connection, LAN connection (Ethernet), and a color touch screen as its outputs. The range, although smaller, is still between 1 MHz and 110 MHz. By contrast, the present invention has a range from 100 Hz up to around 20 MHz, which is well below most if not all testers on the market. The cost of the second known prior art bit error tester is also well above the cost of the present invention.

Further, in both prior art testing units, the unit under test (UUT) is sent a signal from the bit error testers and the output of the unit is sent back into the bit error testers. However, the present invention does not send any signal; one can send any kind of signal into the present invention and the unit under test can manually line up the sent and received signals with one another. The invention does not do anything extra, nor does it have a monitor to look at the waveforms. Its simplicity makes it strictly a BERT instead of a multipurpose tool, which saves on size and on cost.

SUMMARY OF THE INVENTION

The present invention provides a method and device for comparing two generic digital signals over a wide range of data rates and for counting the number of bit errors between digital signals under the conditions of noise and jamming. The bit error tester of the invention compares the digital signal sent with the digital signal received back from the unit under test and outputs the error signal. In the preferred arrangement of the invention, a field programmable gate array is used and a switch and LED display are used to introduce and monitor a time delay in the sent signal to ensure that the signals are in time alignment prior to comparison.

It is therefore an object of the invention to provide a method and device for comparing two generic digital signals over a wide range of data rates.

It is therefore an object of the invention to provide a method and device for counting the number of bit errors between two generic digital signals under conditions of noise and jamming.

It is another object of the invention to provide a method and device for counting the number of bit errors between two generic digital signals under conditions of noise and jamming and outputting an associated error signal.

These and other object of the invention are achieved through the description, claims and accompanying drawings and a field programmable bit error testing device comprising:
   means for sending a signal to a unit-under-test;
   means for receiving a signal from said unit-under-test
   means for introducing a time-delay into data from said means for sending or means for receiving to insure data is in time alignment;
   a comparator circuit for comparing a sent signal to a received signal; and
   an end-circuit for outputting said data from said comparator circuit, thereby allowing an operator to determine degree of error and operating capability of unit-under-test.

DETAILED DESCRIPTION

The present invention provides a Field Programmable Gate Array (FPGA) based bit error tester using, in a preferred arrangement of the invention, a low-cost Xilinx, Spartan II demonstration board was chosen for the project, although this type of unit is used merely by way of example and any compatable commercially available demonstration board may be used. The bit-error-tester compares the signal sent with the signal received back from the unit-under-test (UUT) and output the error signal to a BNC connector. Additionally, in a preferred arrangement of the invention, a switch and LED bar display on the bit-error-tester are used to introduce a time delay in one of the signals to ensure that they are in time alignment prior to comparison.

Figure 1:
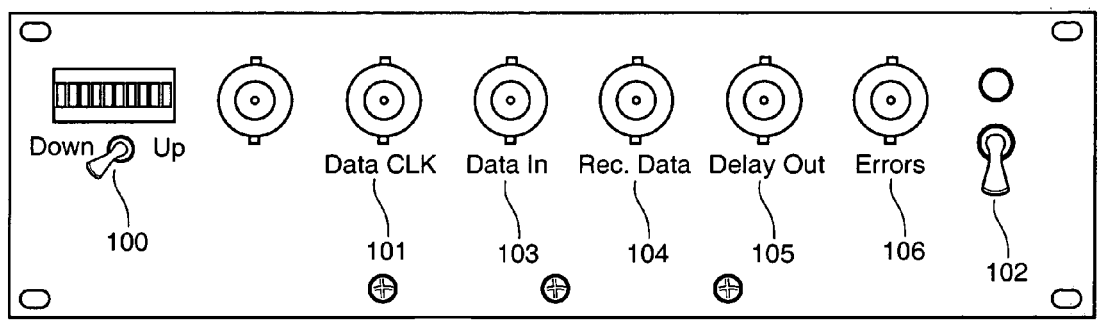
FIG. 1 is a front representation of the bit error tester according to the invention.

A front representation of the bit error tester control panel is shown in FIG. 1. The front panel includes an up/down data input switch at 100, a data clock input at 101, a power switch at 102, the serial data in connection at 103, the received data connection at 103, the delay out connection to an oscilloscope at 105 and the errors output to a bit counter at 106.

Figure 2:
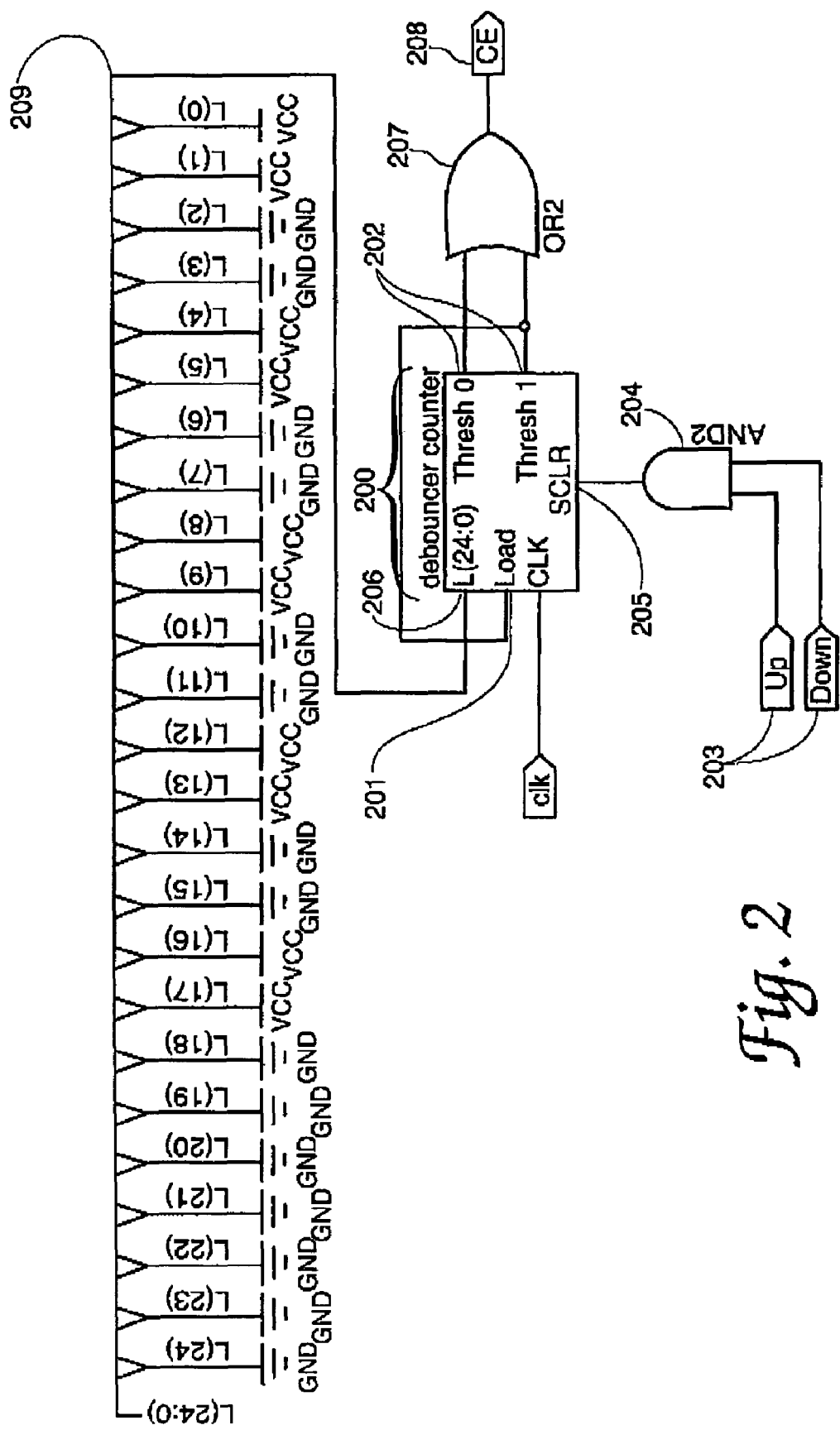
FIG. 2 is a debouncer circuit used in the method and device of the invention.

The first part of the bit-error-tester is the de-bouncer circuit. A schematic of a de-bouncer circuit is illustrated in FIG. 2. The main part of the de-bouncer circuit of FIG. 2 is a 25-bit counter shown at 200. The 25-bit counter 200 has a load input 206, synchronous clear 205, data load, 201 and two thresholds, both of which are illustrated at 202, and a binary number 209 that is sent to load input 206. First, the up and down inputs, illustrated at 203, are combined together using an AND gate 204. These inputs are from an external switch.

Since both inputs cannot be logic '1' at the same time, the output of the gate is almost always zero (it was put in the circuit in case of a short and both inputs becoming logic '1'), which this feeds the synchronous clear 205 input on the counter. The two thresholds 202 are connected to an OR gate 207, and the upper threshold is connected to the LOAD input 206. As the counter reaches the first threshold, the output of the OR gate 207 goes to logic '1', which is labeled CE 208. When the counter reaches the second threshold, the OR gate 207 again goes to logic '1'. The circuit will then go between the data load and the second threshold, as long as either the 'up' or the 'down' input 203 is logic '1'. As the switch is held in either the up or down position, there will be an output signal. The only time this is not true is when the switch is held for less than the time it takes to reach the first threshold. By having the circuit set up as such, there is less of a chance for mistakes.

Figure 3:
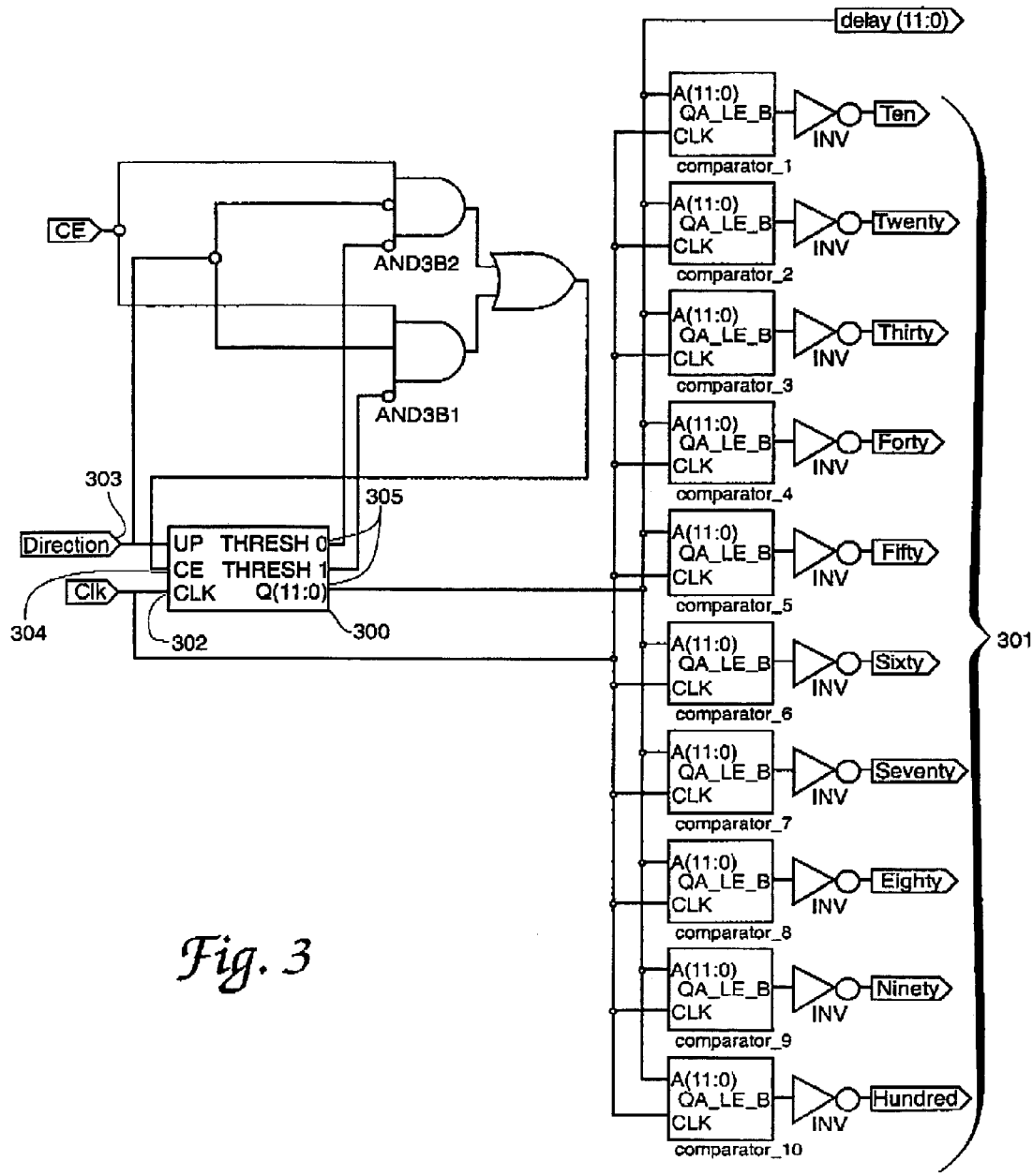
FIG. 3 is a comparator used in the method and device of the invention.

The next part of the bit-error-tester is the comparator. A schematic of a comparator circuit is shown in FIG. 3. The main part of the circuit relies on a 12-bit binary counter 300 and ten comparators, all collectively illustrated at 301. The counter has a clock enable 304, count direction 303, clock 302, two thresholds 305, and a 12-bit parallel output. The low threshold of zero and the high threshold of Hex FF are used to limit the counter, so that when the maximum or minimum value is reached the counter stays at that number instead of flipping over to either the max or min number, depending on the direction of the counter.

The output of the counter 300 then goes to the ten comparators 301 and a 12-bit output. Each of the comparators 301 is set to go to logic '1' when the output of the counter is less than or equal to the constant that is chosen for the comparators. The outputs are then inverted, illustrated by INV, making the LEDs, illustrated at 301, that are connected to the comparators turn on only when the count has exceeded the number that each comparator is set up for. Since there are ten comparators 301, the 12-bit output is broken up into eleven equal partitions: this is so the first LED that is connected will turn on after the first nine percent of the count is reached and the last LED is turned on when the last nine percent is reached. This means that in order to reach a 100 percent shift, the switch must be held in the up direction for another nine percent more after the last LED lights up.

After the comparator and de-bouncer circuits are pushed into symbols, illustrated at 600 and 601, the end circuit is designed. The end circuit can be separated into three sections: the delay switch, shown at 602, the variable delay line, illustrated at 603, and the final output, shown at 604. In the switch, the output of the de-bouncer symbol is sent to the clock enable 705 of the comparator symbol, the down input 614 of the de-bouncer is also sent to the direction input 606 of the comparator, since the switch itself is inverted logic. An internal clock of 100 MHz is used for both symbols, keeping the overall circuit in synchronous logic.

The variably delay line 603 is needed in order to widen the data clock speed. Without the variable line, the delay switch would work for only a very limited clock speed. The 100 MHz clock is sent to the 20 bit counter 608, 20 bit parallel register 609, 14 bit counter 610, and the ram based shift register 711. First, the clock drives the 20-bit counter with a synchronous clear. While doing this, the 100 MHz clock also drives an FD flip-flop 612 that has the data clock as the input. The output of the flip-flop is inverted and sent through and AND gate. The output 613 then goes to the synchronous clear of the 20-bit counter and the clock enable of the parallel register. The output of the 20-bit counter goes to the parallel register, where the most significant 14 bits are sent to the 14-bit counter. The 14-bit counter has a load, threshold, a data load, as well as a clock. The threshold is set to zero and connected to the load of the counter, as well as the clock enable of the ram based shift register. The ram based shift register has the data input from an external signal source and the address for that signal from the switch. The output of the ram based shift register is the delay data, otherwise known as the ram output. The reason for the variable delay is as follows: the switch shifts the delay data at a set speed. If the variable delay line was not there, as the data clock increased in speed so would the delay speed and when there was a decrease in speed the delay would slow down. With the variable delay line, the delay speed will remain the same up to the data clock limit of 100 MHz.

The last section of THE BIT-ERROR-TESTER is the final output 604. Taking the delay data from the ram, it is sent through an XOR gate with the received data. The result of the XOR is fed through a FD flip-flop, with the data clock 615 being the clock signal it uses, and then takes that output and compares it to the data clock signal by means of an AND gate. The final output 616 is the errors between the signals delay data and received data. The reason behind the AND gate is to separate the errors, otherwise if there were two consecutive errors the counter would only count it as one error.

Figure 4:
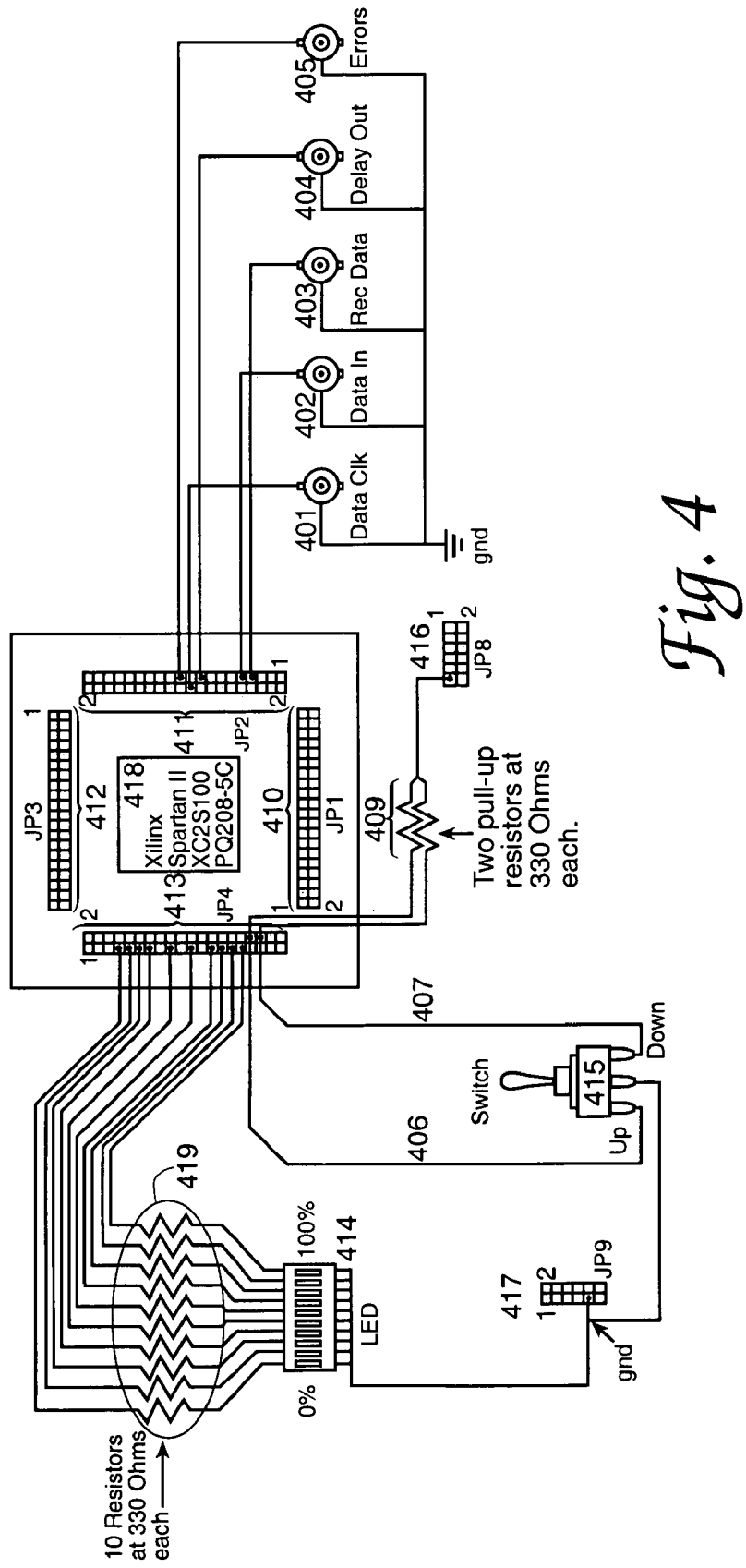
FIG. 4 is a circuit of the graphical pin out of the bit error tester according to the invention.

FIG. 4 is a circuit of the graphical pin out of the bit error tester according to the invention. Data Clk (401), Data In (402), Rec Data (403), Delay Out (404), and Errors (405) are the BNC inputs and outputs that show up on the faceplate. These are connected to the FPGA (418) via the header JP2 (411). The switch (415) is grounded at jumper JP9 (517) and the up (406) and down (407) pins are connected to the header JP4 (413). Also connected to the switch is two pull-up resistors (409) which are connected to jumper JP8 (416). The LED (414) is sent through a series of resistors (419) and then to header JP4 (413). The two headers not used were JP3 (412) and JP1 (410).

Figure 5:
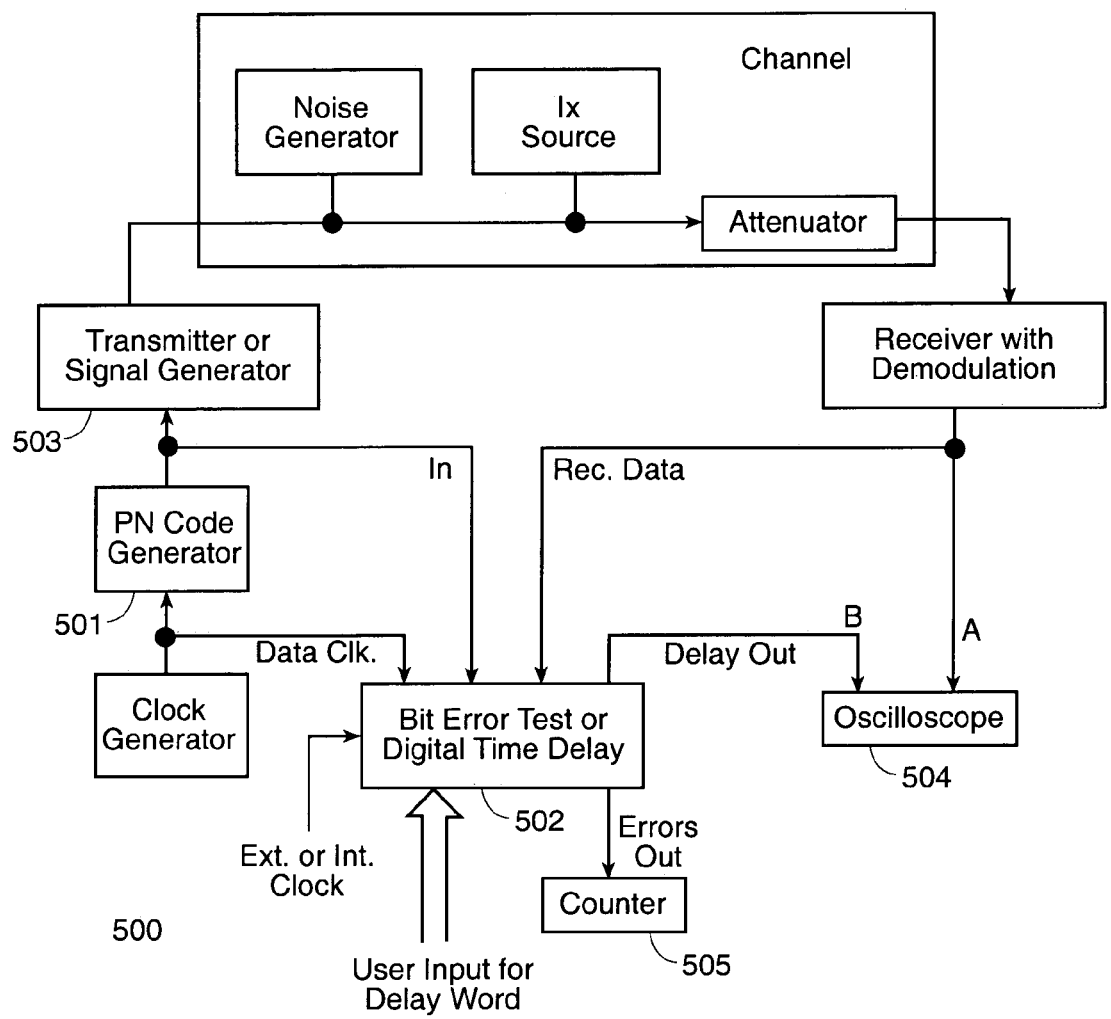
FIG. 5 is a flow graph of a test set up of the bit error tester of the invention.
Figure 6:
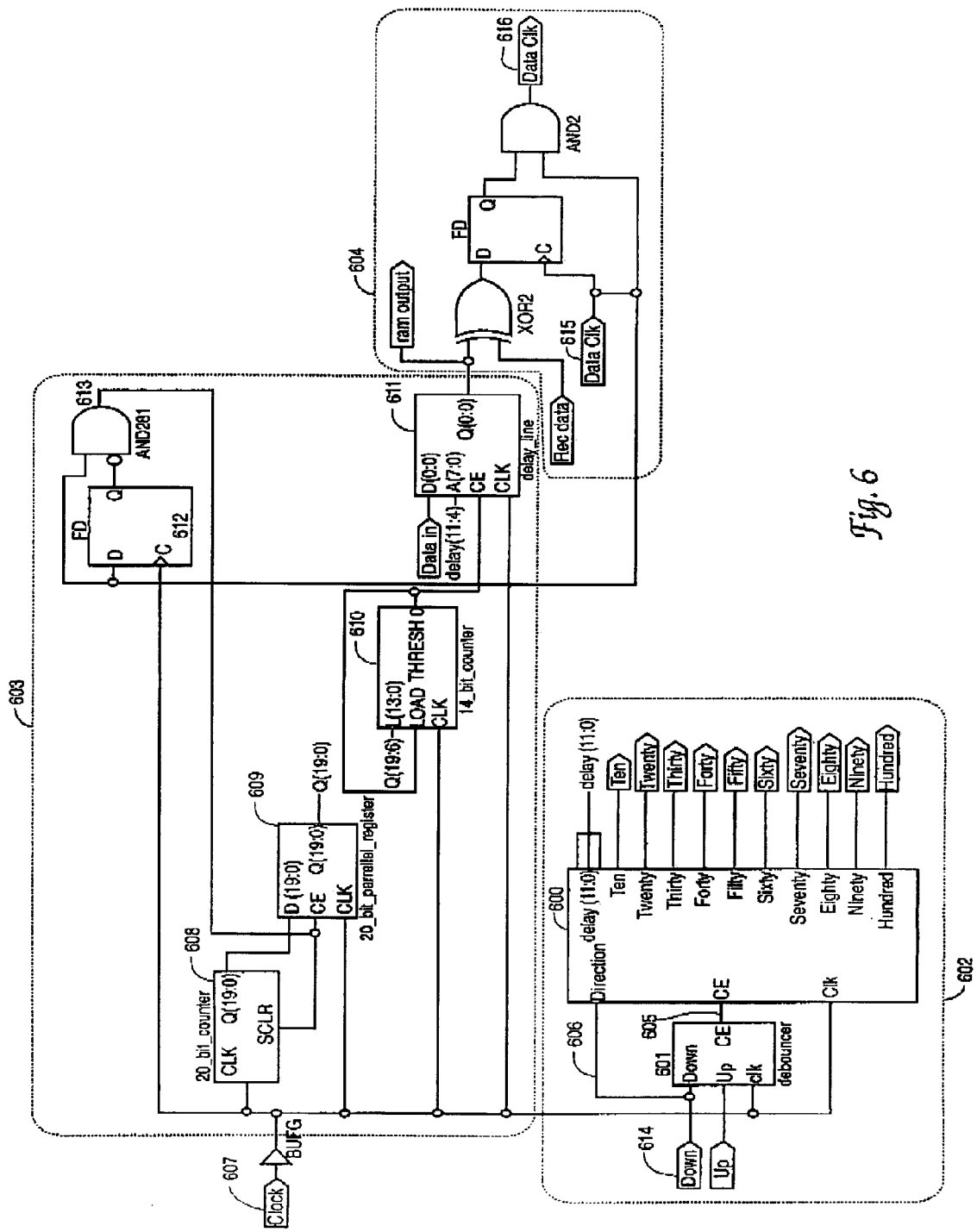
FIG. 6 is a circuit diagram of an end circuit of a bit error testor of the invention.

FIG. 5 is a flow graph of a test set up of the bit-error tester of the invention. For the test set up of FIG. 5, a clock generator 500 is connected to a PN code generator 501 and also to the bit error tester 502. The PN code generator 501 is then connected to the bit error tester 502 and also to a transmitter or signal generator 503. The signal from the PN generator 501 to the bit error tester 502 is the original data signal.

After the transmitted signal has been tested and demodulated, this signal will be sent to an oscilloscope 504, and to the bit error tester 502 to compare errors against the original data signal. Inside the bit error tester 502, the test signal and the delayed signal are compared to one another using xor logic and the output of this is sent to a counter 505, which counts the error between the two signals.

While the apparatus and method herein described constitute a preferred embodiment of the invention, it is to be understood that the invention is not limited to this precise form of apparatus or method and that changes may be made therein without departing from the scope of the invention, which is defined in the appended claims.

We claim:

1. A field programmable bit error testing device comprising:
    means for sending a signal to a unit-under-test comprising a debouncer circuit, said means including:
    25-bit binary counter comprising:
        a load input;
        a clock;
        a first preselected threshold;
        a second preselected threshold;
        up and down inputs combined using an AND gate and input into said 25-bit binary counter;

an OR gate connected to said two preselected thresholds and wherein said first threshold is connected to said load input; and wherein once the counter reaches the first threshold, the OR gate outputs logic 1 and when the counter reaches the second threshold, the OR gate again goes to logic 1 switching back and forth between said load input and said second preselected threshold;

means for receiving a signal from said unit-under-test means for introducing a time-delay into the signal from said means for receiving step;

the comparator circuit for comparing a signal from said means for sending step to the signal from said means for receiving step; and an end-circuit for outputting a time differential from said comparator circuit to an oscilloscope, thereby allowing an operator to determine degree of error and operating capability of said unit-under-test.

2. The field programmable bit error testing device of claim 1 wherein said comparator further comprises:
   a 12-bit binary counter;
   a plurality of comparators for receiving an output of said binary counter;
   wherein said output of said binary counter is inverted when a binary count value is less than or equal to a preselected comparator limit for each corresponding comparator; and
   12-bit parallel output for communicating output of said comparators connected to a plurality of LED's which operate when said binary count value exceeds said preselected comparator limit for each corresponding comparator.

3. The field programmable bit error testing device of claim 2 wherein said 12-bit binary counter comprises:
   a clock receiving a clock enable input;
   means for providing a count direction;
   a first low threshold of zero; and
   a second high threshold of Hex FF for limiting said counter.

4. The field programmable bit error testing device of claim 1 wherein said up and down inputs are operated by an external switch.

5. A field-programmable method of bit-error testing comprising the steps of:
   sending a signal to a unit-under-test;
   receiving a signal from said unit-under test
   introducing a time-delay into a signal from said receiving step to insure signals are in time alignment;
   comparing the signal from said sending step to the signal from said receiving step comprising the steps of
   comparing output of said introducing step to a set logic value using ten comparators; and
   outputting eleven equal partitions based on a 12-bit output;
   and wherein a first LED turns on after the first nine percent of the count is reached and the last LED is turned on when the last nine percent of the count is reached; and
   outputting a time differential from said comparator circuit to an oscilloscope, thereby allowing an operator to determine degree of error and operating capability of unit-under-test.

6. The field-programmable method of bit-error testing of claim 5 wherein said sending step further comprises the steps of:
   inputting a load signal to a 25-bit binary counter;
   clocking said load signal to a 25-bit binary counter;
   determining a first threshold;
   determining a second threshold;
   combining up and down inputs using an AND gate and inputting the output of said combining into said 25-bit binary counter;
   providing an OR gate input connected to said two threshold outputs and connecting said first threshold to a load input; and
   wherein once the counting reaches a first threshold, the OR gate outputs logic 1 and when counting reaches a second threshold, the OR gate again goes to logic 1 switching back and forth between said load input and a second threshold.

7. The field-programmable method of bit-error testing of claim 5 wherein said step of comparing the signal further comprises the steps of:
   providing a 12-bit binary counter;
   receiving an output of said binary counter to a plurality of comparators;
   inverting said output of said binary counter when said output value is less than or equal to a preselected comparator limit; and
   communicating output of said comparators to a 12-bit parallel output which is connected to a plurality of LED's operating when said count values exceeds said preselected comparator limit.

8. The field-programmable method of bit-error testing of claim 7 wherein said providing step further comprises the steps of:
   receiving a clock enable;
   providing a count direction;
   clocking incoming data;
   providing a first low threshold of zero; and
   limiting said counter by providing a second high threshold of Hex FF.

* * * * *